United States Patent
Galburt et al.

(10) Patent No.: US 9,337,014 B1
(45) Date of Patent: May 10, 2016

(54) PROCESSING SYSTEM ARCHITECTURE WITH SINGLE LOAD LOCK CHAMBER

(71) Applicant: Alta Devices, Inc., Sunnyvale, CA (US)

(72) Inventors: Vladimir Galburt, Campbell, CA (US); Alexander Lerner, San Jose, CA (US); Brian Brown, Palo Alto, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 454 days.

(21) Appl. No.: 13/790,326

(22) Filed: Mar. 8, 2013

Related U.S. Application Data

(60) Provisional application No. 61/609,189, filed on Mar. 9, 2012.

(51) Int. Cl.
  H01L 21/677 (2006.01)
  H01L 21/02 (2006.01)

(52) U.S. Cl.
  CPC .............................. H01L 21/02104 (2013.01)

(58) Field of Classification Search
  CPC .................... H01L 21/67748; H01L 21/67754
  See application file for complete search history.

(56) References Cited

U.S. PATENT DOCUMENTS

| | | | |
|---|---|---|---|
| 4,756,815 A | 7/1988 | Turner et al. | |
| 5,613,821 A * | 3/1997 | Muka | H01L 21/67772 414/217.1 |
| 5,658,114 A * | 8/1997 | Mahler | C23C 14/566 414/217 |
| 5,947,802 A | 9/1999 | Zhang et al. | |
| 6,213,704 B1 | 4/2001 | White et al. | |
| 6,270,582 B1 | 8/2001 | Rivkin et al. | |
| 6,679,671 B2 | 1/2004 | Blonigan et al. | |
| 6,688,375 B1 | 2/2004 | Turner et al. | |
| 6,719,515 B2 | 4/2004 | Tolmon et al. | |
| 6,719,517 B2 | 4/2004 | Beaulieu et al. | |
| 7,073,160 B2 | 7/2006 | Chao et al. | |
| 7,182,122 B2 * | 2/2007 | Koguchi | H01L 21/67109 118/719 |
| 7,665,951 B2 * | 2/2010 | Kurita | C23C 14/566 414/217 |
| 7,677,859 B2 | 3/2010 | Gilchrist et al. | |
| 2004/0020601 A1 | 2/2004 | Zhao et al. | |

FOREIGN PATENT DOCUMENTS

EP 1124252 A2 8/2001

* cited by examiner

*Primary Examiner* — Jonathan Snelting
(74) *Attorney, Agent, or Firm* — Thomas Schneck; Gina McCarthy

(57) ABSTRACT

A substrate processing system architecture includes an MOCVD reactor processing module coupled to a single three-level load lock chamber. The load lock has a heater at a first stationary location, a cold plate at a second secondary location, and a three-level transport system between the heater and cold plate. The transport system has two-position carrier transfer assembly with upper and lower stages, where the upper stage may move between an intermediate transfer level and an upper level proximate to the heater while the lower stage moves between a lower level proximate to the cold plate and the transfer level. The choreography of substrate transport between external loader, load lock and reactor allows substrates to be processed in the reactor while other substrates are post-process cooled, unloaded, and a new substrate loaded and preheated.

6 Claims, 9 Drawing Sheets

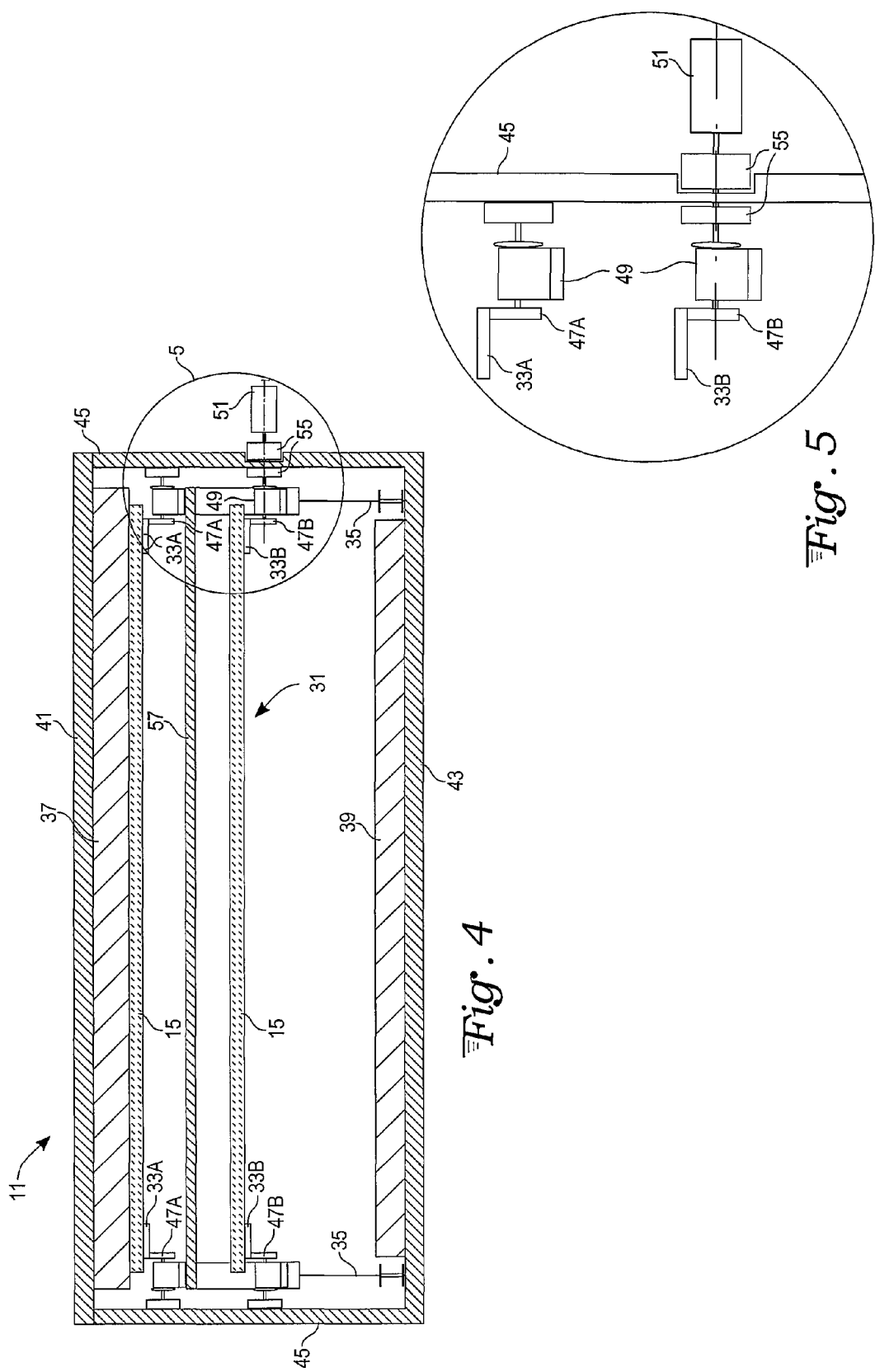

PROCESSING SYSTEM ARCHITECTURE WITH SINGLE LOAD LOCK CHAMBER

CROSS-REFERENCE TO RELATED APPLICATION

This application claims priority under 35 U.S.C. 119(e) from prior U.S. provisional application No. 61/609,189, filed Mar. 9, 2012.

TECHNICAL FIELD

The present invention relates to substrate processing system architectures, such as for MOCVD processing of semiconductor wafers, and methods for choreographing the movement of substrates through such system architectures for best overall throughput. The invention also relates to load lock chambers in such processing systems for facilitating the preparation and movement of substrates into and out of one or more processing modules, such as into and out of a MOCVD reactor.

BACKGROUND ART

In order to maximize utilization of a process module, we need to minimize overhead time spent on exchanging carriers into and out of the process module, minimize the time for keeping the process chamber door open, and improve wafer heating and cooling cycles. In substrate processing there are several possible system architectures. One of the more common is the cluster tool arrangement, in which multiple processing modules and one or more load locks are all clustered around a central transfer chamber. Other systems may employ an in-line arrangement with load locks on each end of a string of one or more processing modules, as for example in U.S. Pat. No. 6,679,671 to Blonigen et al. or in U.S. Pat. No. 6,213,704 to White et al. The environment within the respective modules and load locks are isolated from each other and from the exterior environment by gates that open only for wafer transfer when certain environmental conditions (gas composition, pressure, temperature, etc.) in adjacent modules have been made sufficiently compatible to prevent cross-contamination.

In U.S. Pat. No. 6,688,375, Turner et al. describe a load lock chamber having a two-level transport with heating elements incorporated into the transport's upper level and with cooling elements incorporated into the transport's lower level. A thermal barrier is provided between the two levels of the transport. Loading a wafer into the upper level allows that wafer to be preheated prior to moving into a process module. The lower level allows for cooling of wafers received from a process module prior to unloading.

Load locks are relatively expensive for what they accomplish. However, given the requirements of overall wafer throughput, in-line system configurations are generally acknowledged in the technology field to require two such load locks, one at each end of the processing line. Elimination of one such load lock from such substrate processing systems would reduce cost of the system, and could even reduce per unit cost of processed substrates if it could be done without substantially reducing the overall throughput. Finding a way to minimize throughput loss from any such system configuration change is desired.

SUMMARY DISCLOSURE

An improved load lock architecture stages a loading and preheating of carriers with wafers in the load lock chamber, an exchange of carriers with a process chamber, and a post-process cooling and unloading of the wafer carriers in the same load lock chamber.

In particular, a three-level load lock architecture is provided for moving carriers with wafers within the chamber on vertical and horizontal axes. Loading and unloading of wafer carriers into and out of the load lock and the exchange of wafer carriers between the load lock and process module are facilitated by horizontal transfer of carriers in a transfer plane, while the respective preheating and post-process cooling of wafers is facilitated by vertical movement of carriers within the three-level load lock, raising carriers to an upper level or heating plane proximate to a heater for preheating of the wafers, and lowering carriers to a lower level or cooling plane proximate to a cold plate for the post-process cooling of wafers. The three-level load lock has a two-position carrier transfer assembly with upper and lower stages that support wafer carriers. In an upper position of the transfer assembly, the upper stage is in the heating plane proximate to the heater while the lower stage is in the transfer plane; in the lower position of the transfer assembly, the lower stage is in the cooling plane proximate to the cold plate while the upper stage is in the transfer plane. Accordingly, in its upper position the transfer assembly facilitates simultaneous preheating of wafers in a carrier disposed on the upper stage and transfer of a wafer carrier from the process module onto a lower stage of the transfer assembly. Likewise, in its lower position the transfer assembly facilitates simultaneous cooling of wafers in a carrier disposed on the lower stage and transfer of a carrier from the upper stage into the process chamber. Therefore, the three-level load lock increases process chamber utilization and overall MOCVD throughput. Additionally, capital expenditure is reduced with this three-level load lock compared to loop and shuttle-batch configurations that require two of the prior load locks, since the present invention requires just a single load lock.

Thus, in a wafer processing system with a load lock chamber coupled to a processing module, the three-level load lock chamber in accord with the invention includes a heater at a first location within the load lock chamber, a cold plate at a second location within the load lock chamber in vertical relation to the heater, and a three-level transport system located between the heater and cold plate. The transport system is adapted to receive a wafer carrier at an intermediate transfer level and vertically move the carrier into a selected upper or lower level in proximity with one of the heater and cold plate. More particularly, the transport system includes a two-position carrier transfer assembly with upper and lower stages, wherein in a lower position of the transfer assembly the upper stage is at the intermediate transfer level and the lower stage is at the lower level in proximity to the cold plate, and wherein in an upper position of the transfer assembly the lower stage is at the intermediate transfer level and the upper stage is at the upper level in proximity to the heater.

A method of operating a wafer processing system having a such a three-level load lock chamber, wherein the load lock chamber has a first door interfacing with an external environment of the system and a second door interfacing with a processing module of the system, may comprise steps such as: (a) transporting a wafer carrier through the first door from the external environment into the load lock chamber, the transfer assembly being in the lower position and the wafer carrier being loaded at the transfer level onto the upper stage; (b) raising the transfer assembly into the upper position such the wafer carrier is at the upper level proximate to the heater; (c) transporting any wafer carrier in the processing module through the second door into the load lock chamber, the wafer carrier being loaded at the transfer level onto the lower stage; (d) lowering the transfer assembly into the lower position such that the wafer carrier on the lower stage is at the lower level proximate to the cold plate and the wafer carrier on the upper stage is at the transfer level; (e) transporting the wafer carrier on the upper stage through the second door into the processing module; (f) raising the transfer assembly into the upper position such that the wafer carrier on the lower stage is at the transfer level; (g) transporting the wafer carrier on the lower stage through the first door into the external environment; and (h) repeating steps (a) through (g).

Coupling between one or more external motors and internal rollers in the stages of the carrier transfer assembly may be provided by an electromagnetic clutch. The load lock uses electromagnetic clutches (rather than permanent magnets) to engage and disengage external motors for the upper and lower stage rollers needed for carrier exchange, loading and unloading. When the two-position carrier transfer assembly needs to move vertically between its upper and lower positions, each electromagnetic clutch turns off to disengage the stage from its motor. When the transfer assembly has reached its upper or lower position, electromagnetic clutches turn back on, so as to recouple each stage's rollers to respective drive motors. Internal rollers for each one of the upper and lower stages of the carrier transfer assembly may be mechanically coupled (e.g. using belts or cables) so that groups of rollers in each stage can be respectively driven by a single dedicated motor (instead of separate motors for every roller).

The load lock provides both a dedicated resistive heater (replacing lamps) in a top portion of the load lock and a dedicated cooling plate in a bottom portion of the load lock to reduce cooling time. Thermal isolation is provided in the form of a water-cooled reflector plate between the upper and lower stages of the transfer assembly. This thermal isolation plate has a polished reflective film or finish to reject radiation. The thermal isolation plate has an added benefit of preventing cross-contamination between finished and unfinished wafers in respective lower and upper stages of the transfer assembly.

A surface of the cold plate may have raised portions fitting within corresponding openings in an underside of a received wafer carrier when moved to the lower level proximate to the cold plate.

BRIEF DESCRIPTION OF THE DRAWINGS

FIG. 4 is an end view of a three-level load lock chamber for use in a processing system in accord with the present invention.

FIG. 5 is a close-up view of the transport drive and magnetic coupling within the circle 5 of FIG. 4.

DETAILED DESCRIPTION

MOCVD System

Figure 1:
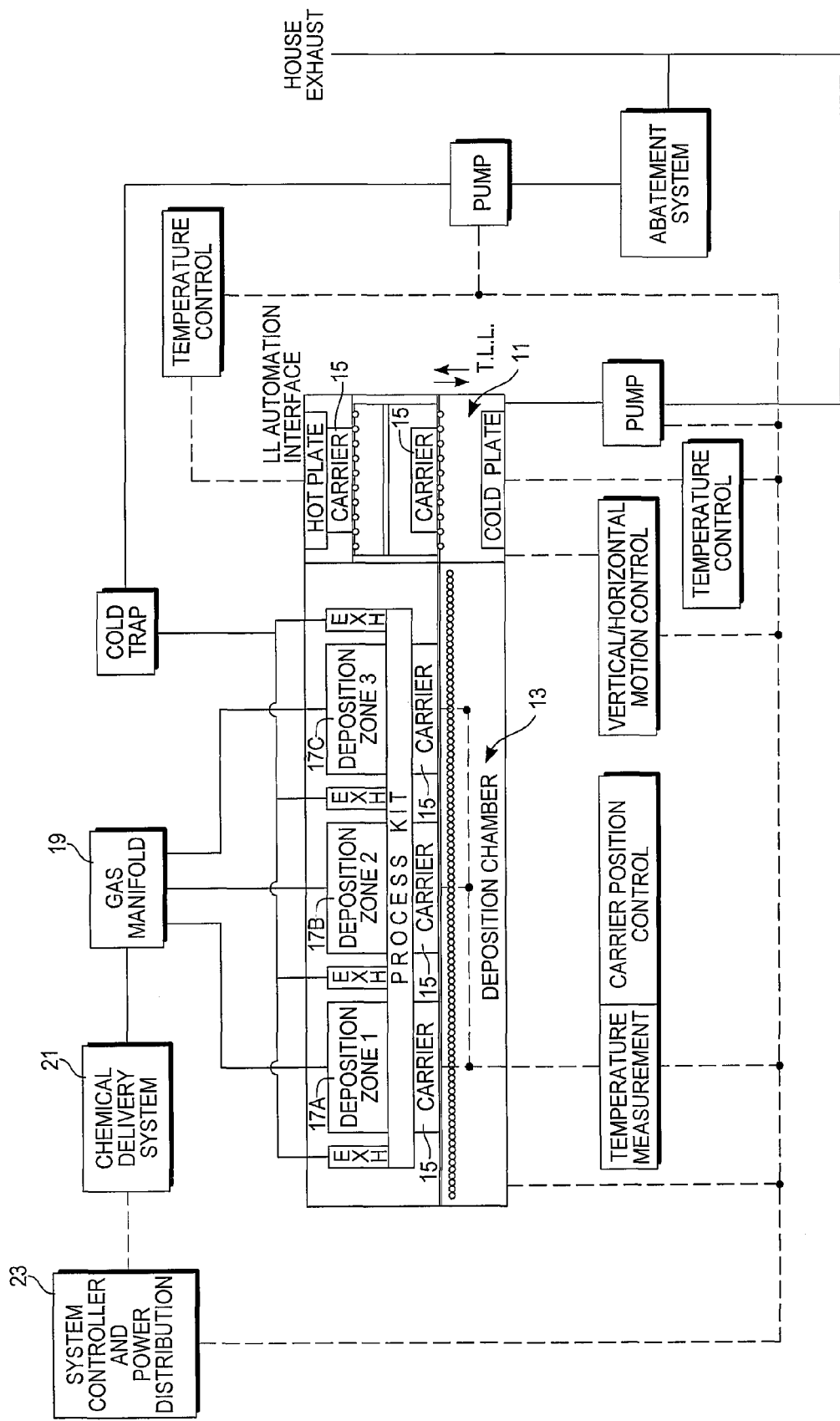
FIG. 1 is a block schematic diagram of an embodiment of a MOCVD wafer processing system with a single three-level load lock chamber in accord with the present invention.
Figure 2A:
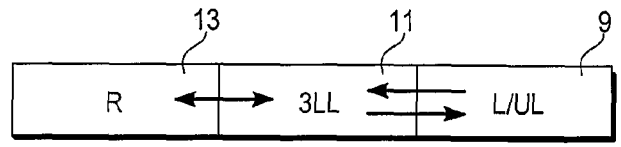
FIGS. 2A and 2B are simplified schematics illustrating main components of a processing system as in claim 1 in two possible configurations.
Figure 2B:
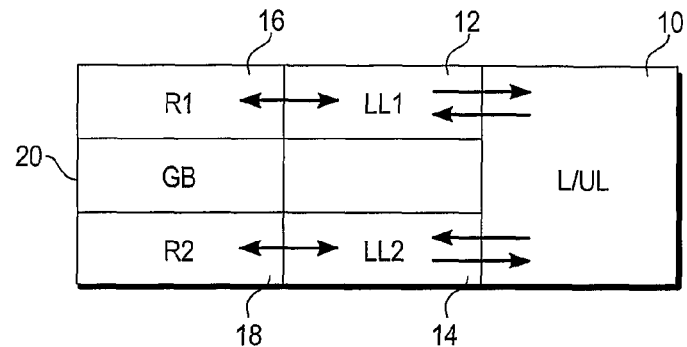

The three level load lock (3LL) 11 optimizes use of the MOCVD system's process chamber 13, shown in FIG. 1, and minimizes overhead time for improved throughput. It also removes the need for separate load lock chambers on both sides of the process chamber, one for loading and preheating and another for post-process cooling and unloading, therefore reducing system cost. Instead, the 3LL is capable of dedicated heating and cooling in the same chamber. Two possible system configurations are seen in FIGS. 2A and 2B, with one or more MOCVD reactors R and a one three-level load lock 3LL per reactor. In the most basic configuration in FIG. 2A, a single reactor 13 couples to a single load lock 11, and this in turn may couple to load/unload automation 9. In the case of the twin batch configuration 20 in FIG. 2B, a pair of reactors 16 and 18, each with their own load lock 12 and 14 respectively, may share a common gas box GB. The two load locks 12 and 14 may also share common load/unload (L/UL) automation 10, i.e. a common wafer loader.

An embodiment of a MOCVD system that has been upgraded with a three-level load lock 11 is illustrated in FIG. 1. It has an initial target throughput of 120 wafers per hour and an overall equipment effectiveness of 85% or greater. The system can initially be installed without an automated wafer loading system attached to it, with carriers 15 being loaded into and unloaded out of the load lock by using a carrier cart. In that case, an interface with the cart would include an interlocking scheme that prevents opening of the load lock's outer door without the cart being present. Ultimately, a fully automated system would include a wafer loading system 9 (or 10) that interfaces with the load lock 11 (or two load locks 12 and 14). A process module 13 may, be a MOCVD reactor or deposition chamber with one or more deposition zones 17A-17C communicating through a manifold 19 with a MOCVD chemical delivery system 21. The process module or reactor 13 interfaces with the load lock 11 for the transfer of carriers 15 into and out of the process module 13. In one embodiment, the carrier may support a 4×4 array of wafers, but other carrier sizes are possible. The system as a whole is integrated, including modules, sub-modules, and/or individual components coordinated by a system controller 23. Movement of the wafer carriers, both horizontally and vertically in the three-level load lock 11 and also horizontally in the one or more deposition zones 17A-17C of the process module 13, is computer controlled. Control of pumps and valves for pressure control in the each of the load lock and process module are provided. Temperature measurement and control are also provided for each of the deposition zones in the process module and also of the heater and cold plate in the load lock.

Three-Level Load Lock Chamber

Figure 6:
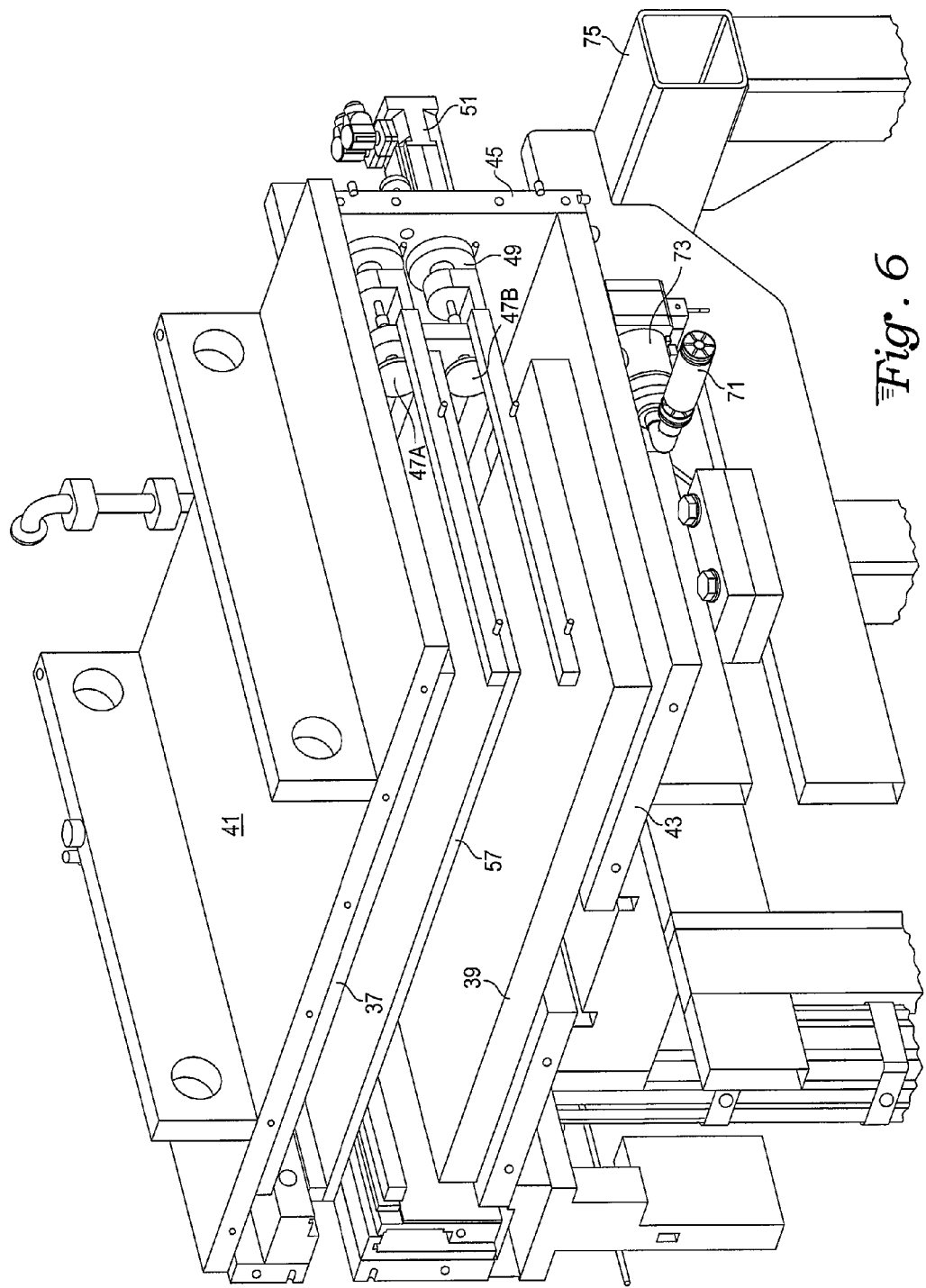
FIG. 6 is a perspective view of the three-level load lock chamber of FIG. 4.

The three-level load lock chamber 11 (best seen in FIGS. 4, 6 and 8B) will have a two-position, three-level transport system or transfer assembly 31 that supports up to two wafer carriers 15. At any time, one carrier may be placed in a transfer plane while another may be in either of a heating or cooling zone of the chamber. The following are major load lock components:

1. A transport system 31 with two shelves or stages (i.e., an upper stage 33A and a lower stage 33B).
2. A vertical motion mechanism 35 that moves the transport system between two positions (i.e., an upper position and a lower position) using hard stops/optical sensors to set the carrier at a preset spacing from the heater 37 or cold plate 39.
3. A resistive heater 37 integrated into the chamber lid 41 and capable of preheating a load (i.e., the carrier with wafer substrates) up to 400° C.
4. A cold plate 39 integrated into the bottom 43 of the chamber and capable of rapidly cooling the load from 400° C. to below 200° C. within 90 seconds.
5. A water cooling system providing uniform cooling to all chamber components that require cooling (including the cold plate and a reflector plate between the stages of the transport system).
6. A chamber enclosure 45 for supporting the aforementioned components and for allowing for depressurization within the chamber to a controlled pressure level.
7. A MONOVAT door connecting the load lock chamber with the process module.
8. An atmospheric door connecting the load lock with the outside carrier cart or loading automation.
9. A controlled interface that includes a set of fasteners and location pins, and a control system interlock that prevents the opening of one or either door under specified conditions (e.g., chamber pressure, transport system position, presence/location of carrier cart or automation condition).
10. A control system with all necessary sensors to provide horizontal positioning of a carrier in the transfer plane, vertical motion and position control of the transport system, interface and interlock control
11. Auxiliary equipment such as vacuum pump(s) 71 and control valves 73, cooling manifold, power distribution system, and others to provide temperature, pressure and motion control in the TLL chamber.

The chamber should comply with vacuum chamber requirements (e.g. pressure control range of 1 Torr-760 Torr and a leak rate less than 1×E-9 Std.). The vacuum pump(s) should be able pump down from standard atmosphere (760 Torr=100 kPa) to 1 Torr (=133 Pa) within 10 seconds.

Load Lock Operation

Figure 3A:
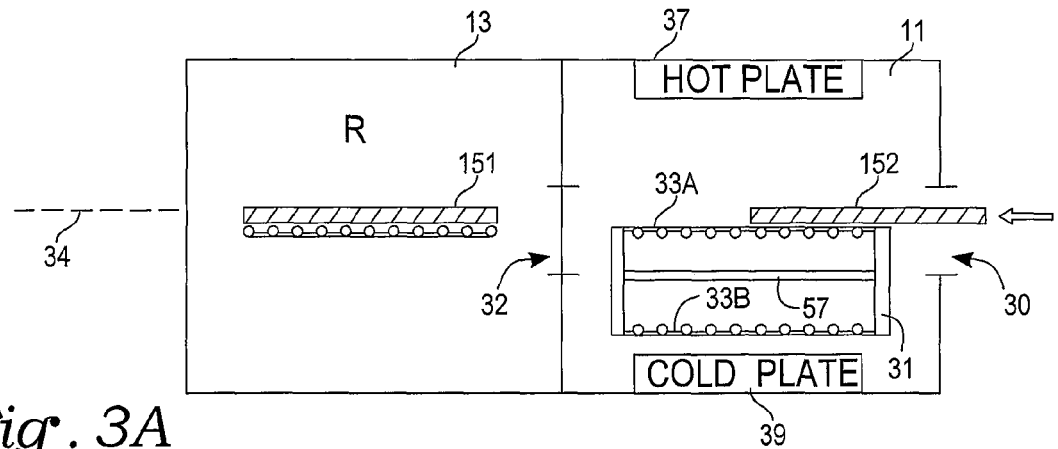
FIGS. 3A-3G are schematic side views of the reactor and load lock chamber of the system in a time sequence of configurations illustrating a choreography of substrates being processed in a method of operating the system of FIG. 1.
Figure 3B:
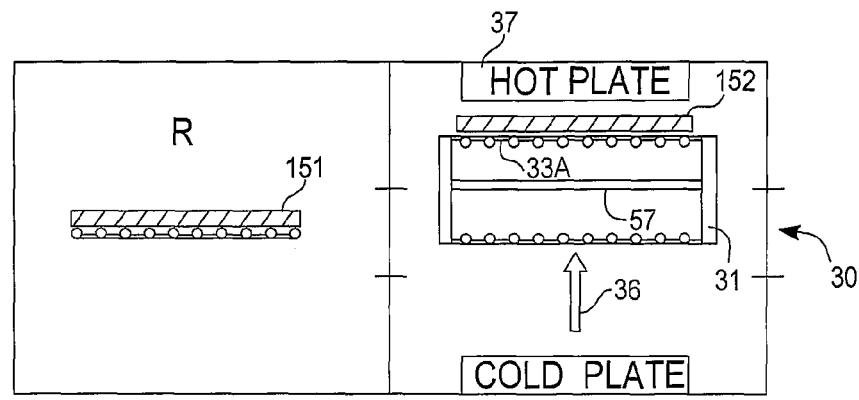
Figure 3C:
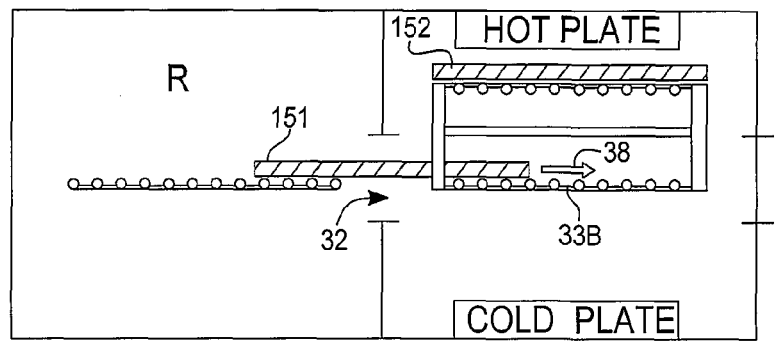

An example of a sequence of operations in the load lock and choreography of wafer movement within the processing system is as follows with reference to FIGS. 3A-3G:

1. Transport system 31 is in its lower position (FIG. 3A). Transport drive is engaged via electromagnetic coupling. That is, a motor drives the rollers of the upper stage or shelf 33A of the transport system). A previously loaded carrier 151 with wafers may be present within the reactor 13.
2. Carrier 152 is loaded onto the upper shelf from the carrier cart or automation along transfer plane 34. The lower shelf 33B is initially empty, but in later repeating of this step may have a carrier with processed wafers being cooled by cold plate 39, thermally isolated from the hot zone by reflector 57.
3. External door 30 closes and the transport transmission is disengaged by powering down the electromagnetic coupling in the drive mechanism.
4. Vertical drive moves (represented by arrow 36) the transport system 31 to an upper position (FIG. 3B) In a later repetition vertical drive moves (represented by arrow 44) the transport system 31 to an upper position shown in FIG. 3F.

Figure 3D:
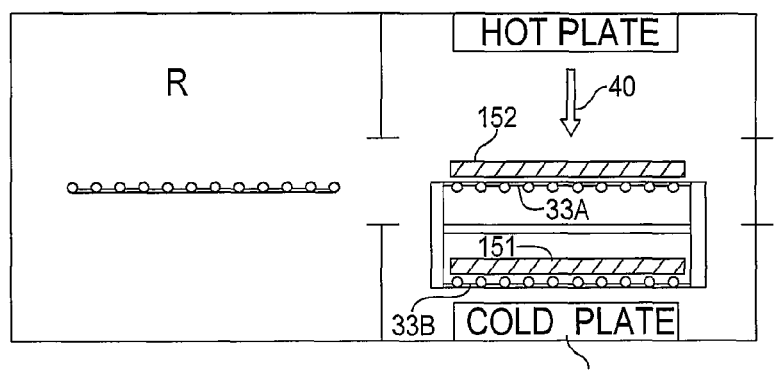
Figure 3E:
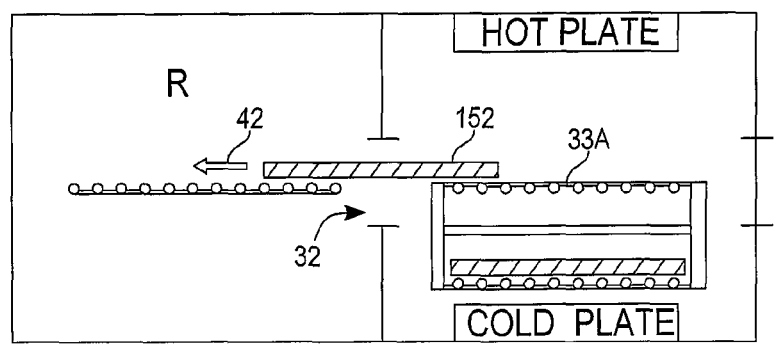
Figure 3F:
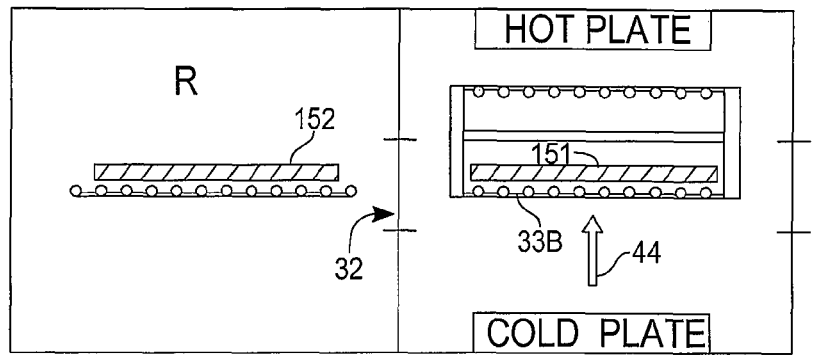
Figure 3G:
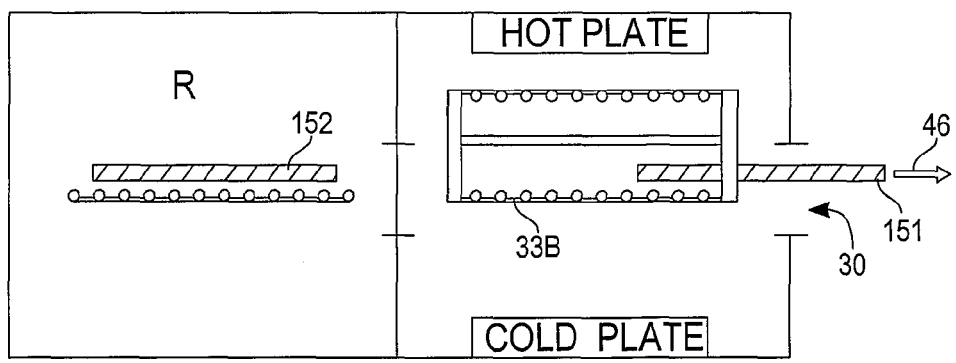

The carrier 152 on the upper shelf 33A is now in proximity to the heater 37 (heating zone) for wafer preheating. Any carrier on the lower shelf is now in the transfer level for unloading through the external door 30, as seen in FIG. 3F.
5. Transport drive is re-engaged with the lower shelf transport system. External door 30 may be opened to unload any carrier 151 from the lower shelf 33B (FIG. 3G), and then the external door closes 30. Carrier 151 is moved horizontally in the direction of arrow 46 when unloaded.
6. Carrier 152 on upper shelf 33A is preheated (FIG. 3B) to a set temperature using the resistive heater 37 with pre-set parameters and temperature sensing and control.
7. When process module 13 is done processing wafers on carrier 151, the internal door 32 between process module and the load lock opens and the processed carrier 151 is transferred (in the direction of arrow 38) onto the lower shelf 33B of the load lock (FIG. 3C).
8. The transport transmission is disengaged.
9. As seen in FIG. 3D, the vertical drive moves the transport system 31 to the lower position (represented by arrow 40). The carrier 151 on the lower shelf is now in proximity to the cold plate 39 (cooling zone) for wafer post-process cooling.
10. Transport drive is re-engaged with the upper shelf transport system.
11. As seen in FIG. 3E, preheated carrier 152 is moved horizontally in the transfer plane (represented by arrow 42) from the upper shelf 33A of the load lock through the open inner door 32 into the process module.
12. Internal chamber door 32 is closed.
13. Carrier 151 with processed wafers on lower shelf 33B is cooled down by the cold plate 39 while the load lock chamber goes through a pump/purge routine.
14. Transport transmission is disengaged. Return to step 1.

Figure 10:
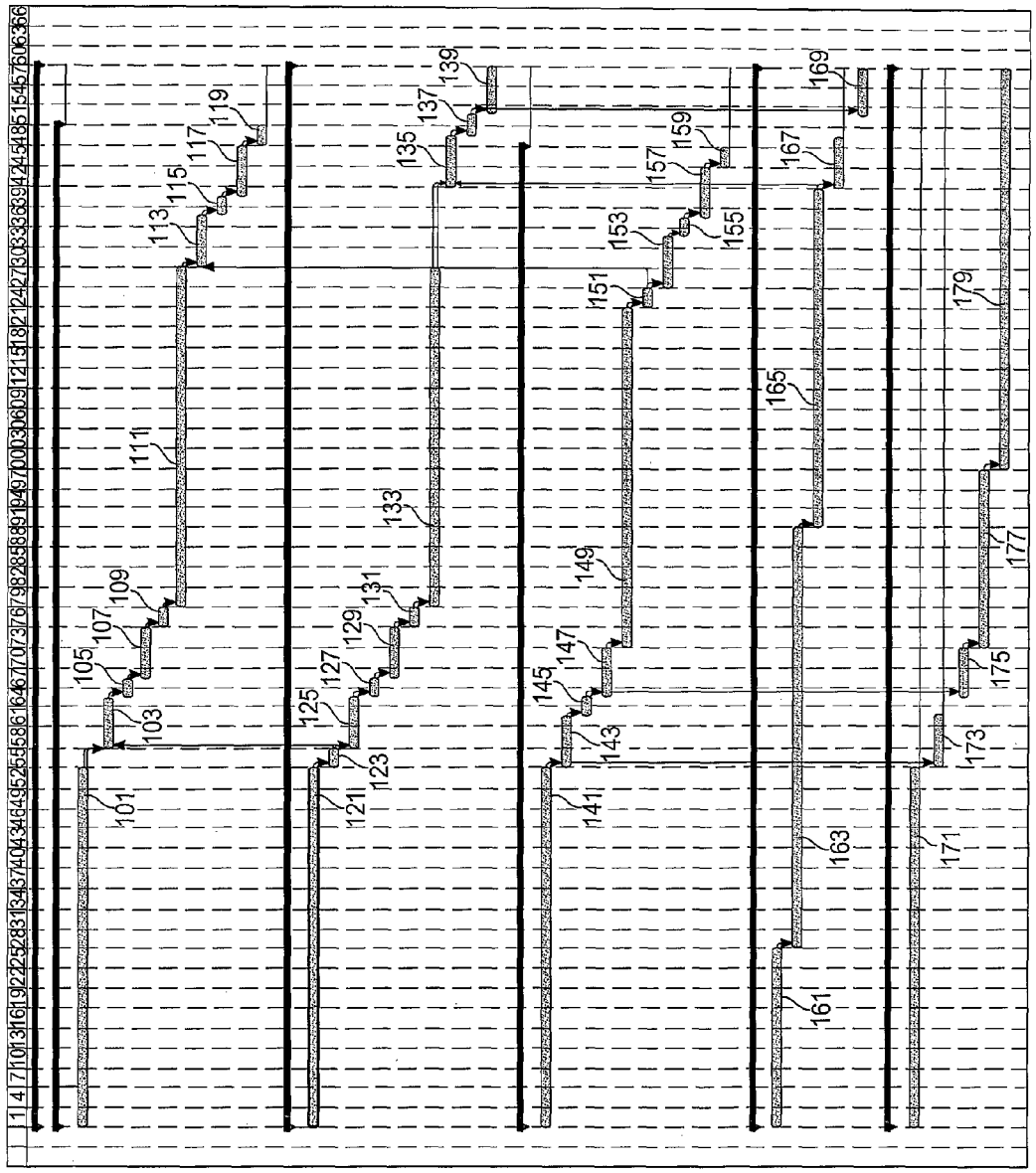
FIG. 10 is a timing diagram showing a sequence over time within a wafer loader, first and second three-level load locks, and corresponding first and second MOCVD reactors according to a system configuration as in FIG. 2B.

The sequence of steps is also illustrated in the timing diagram in FIG. 10 with reference to the twin batch configuration of FIG. 2B. It should be acknowledged that generally the processing time within an MOCVD reactor is at least twice as long and often closer to three times as long as the time needed for wafers within the load lock for either preheating or post-process cooling. For example, a typical MOCVD reactor may require 45 seconds for heating a wafer from its 400° C. preheat temperature to 800° C. for deposition (161 and 177 in FIG. 10), another 105 seconds for deposition itself (163 and 179 in FIG. 10), and another 90 seconds for cooling back down to 400° C. (165 and 171 in FIG. 10). A three-level load lock in accord with the present invention may take about 90 seconds each to either vacuum pump the chamber and preheat a wafer (133 and 141 in FIG. 10) or to vacuum vent back to atmospheric pressure and post-cool a wafer (121 and 149 in FIG. 10). Vertical transfer of the transport assembly between upper and lower positions may take approximately 5 seconds (123, 127, 131, 137, 145, 151, 155, and 159 in FIG. 10). Horizontal transfer between load lock and reactor may take approximately 12.5 seconds (135, 139, 143, 147, 167, 169, 173, and 175 in FIG. 10). Likewise, loading and unloading of substrate carriers between the load lock(s) and wafer loader apparatus may take approximately 12.5 in a representative timing model (103, 107, 113, 117, 125, 129, 153, and 157 in FIG. 10). Indexing (105, 109, 115, 119) and buffering (101, 111) of the loader is also represented in the timing shown in representative FIG. 10. It can be seen that the use of the common wafer loader automation by the twin load locks in interleaved, so that the first load lock and its corresponding process module or reactor operates 180° out-of-phase in its timing relative to the second load lock and its corresponding reactor. This also allows a common gas box to be used by both reactors, since only one reactor needs a gas supply at any given time (163 and 179).

Transport Drive/Transmission

Figure 7:
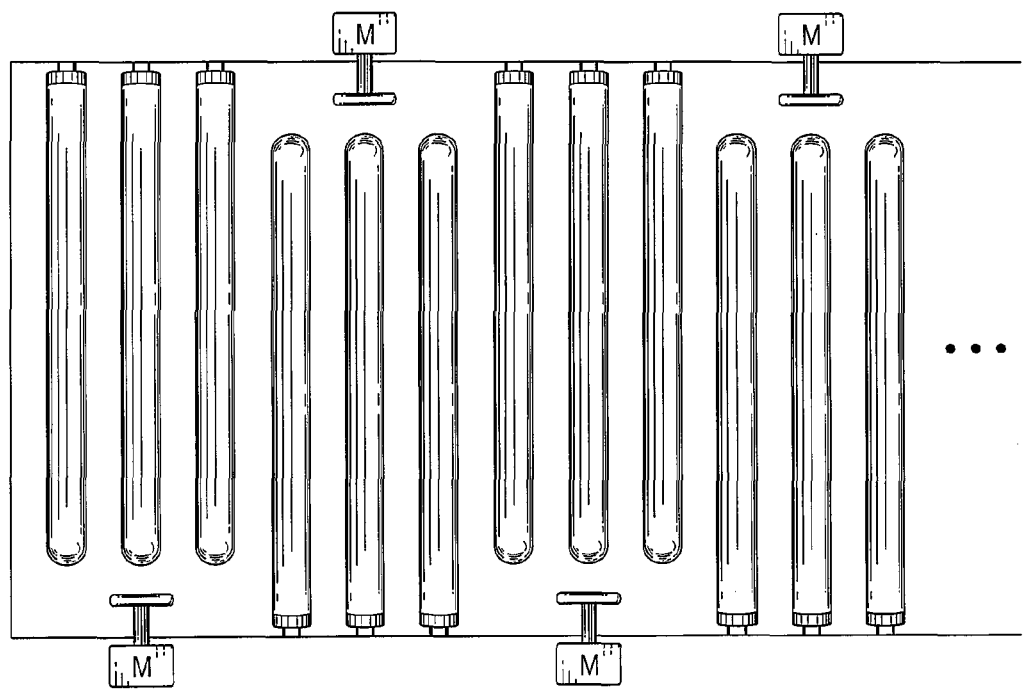
FIGS. 7 and 8A are respective top views of a load lock chamber and its transport drive, first of the prior art (FIG. 7) with individually driven motors interleaved with substrate preheating lamps, and second of a new configuration (FIG. 8A) with a single drive and a belt coupling for a set of transport rollers, one for each side of the load lock.
Figure 8A:
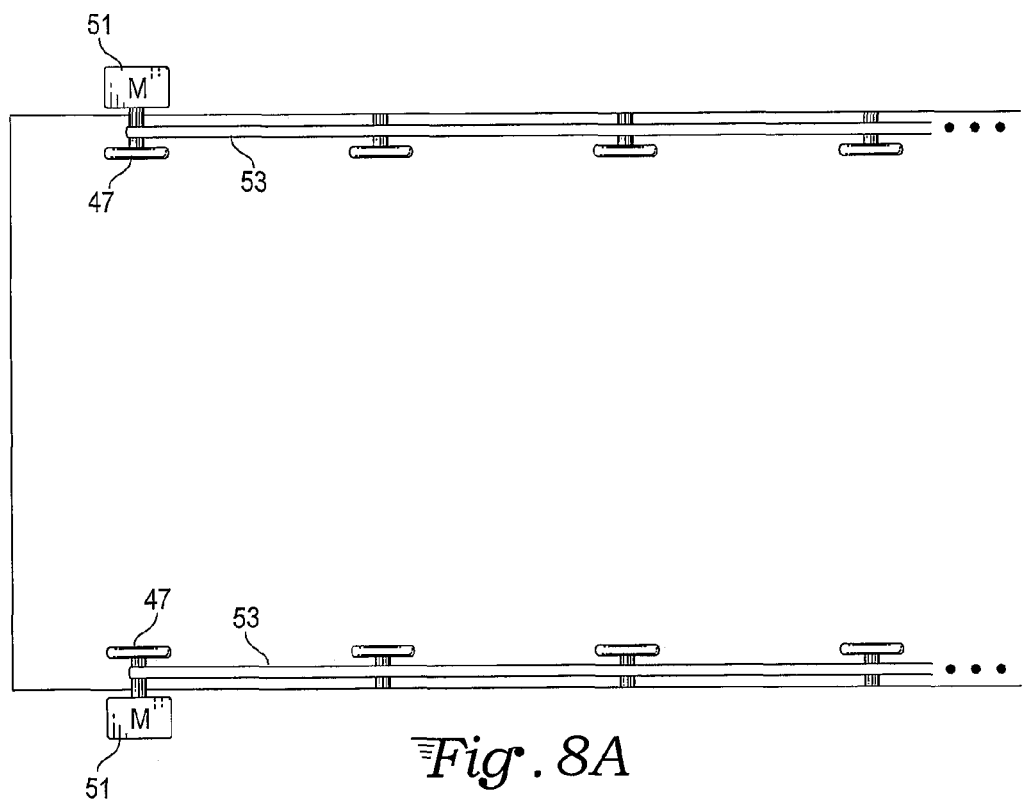
Figure 8B:
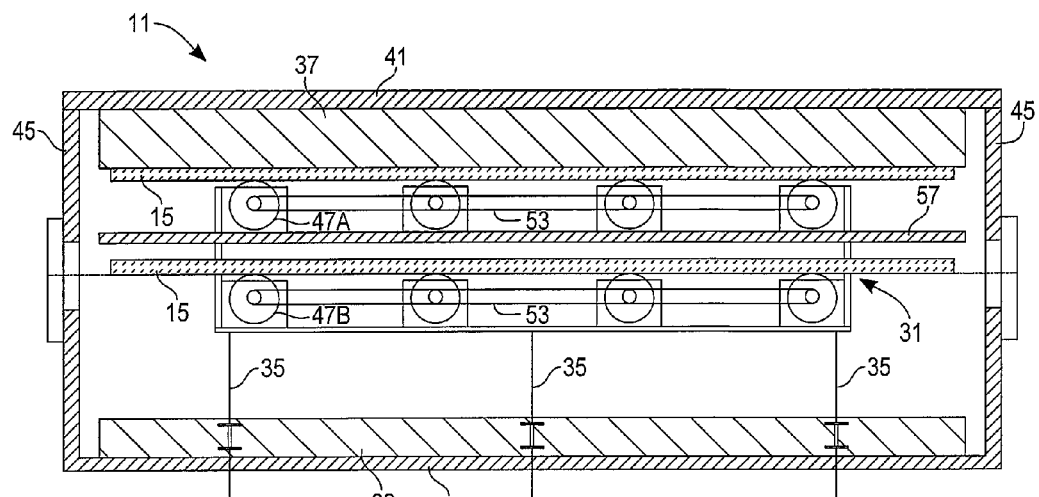
FIG. 8B is a side view of the load lock chamber of FIGS. 4 and 6.

The transport system provides bidirectional horizontal motion of the carrier in the transfer plane, as well as vertical movement of the whole transfer assembly between two set positions. The transport assembly includes a frame 75 supporting two sets of rollers 47A and 47B on bearing blocks 49 in two planes spaced a specified distance (e.g. 15 cm) apart. Horizontal motion is provided by the rollers 47A and 47B. As seen in FIGS. 4, 8A and 8B, one roller per side is a driver that connects to an external drive mechanism (motor) 51 through an electromagnetic clutch 55 (visible in FIGS. 5 and 6). The set of rollers 47 in a given plane (e.g. four rollers on each side) have a kinematic connection with each other. This mechanical connection may be provided by pulleys, timing belts, or similar means 53 (in place of the prior synchronizing of individual motors M for each roller as in FIG. 7). The connection between the rollers in a plane is made inside the load lock chamber so no feed through is required. There will always be one set of rollers 47A or 47B in the transfer plane and engaged with the horizontal motion drive motor(s) 51, while the other set of rollers will be in either the heating or cooling position and disengaged from horizontal motion. Water cooling of the transfer assembly helps protect the rollers as well as pulleys and belts from excessive heat in the heating (upper) position.

Vertical motion of the transfer assembly may be provided by a set of motors or guide assemblies 35 under the load lock chamber. The pass through the chamber wall could be done by using a bellows and piston assembly.

Figure 9:
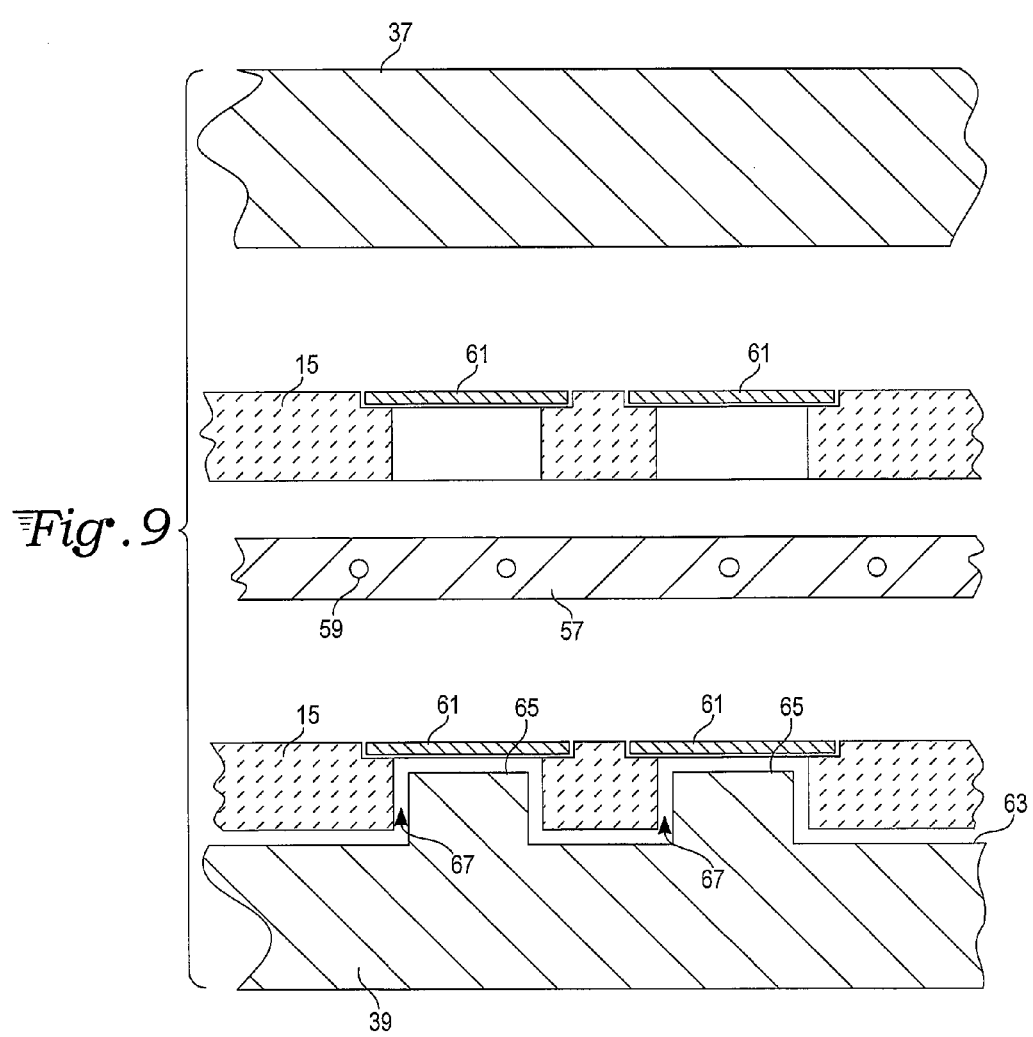
FIG. 9 is a side sectional view of a close-up of wafer substrates on carriers interacting with one embodiment of a cold plate within a three-level load lock in accord with the present invention.

Since the load lock chamber has both a resistive heater 37 and cold plate 39, which are always on, there is need to eliminate cross-talk between and thereby separate the respective hot and cold zones. The transfer assembly frame 31 preferably includes a reflector plate 57 (seen in FIGS. 4, 6 and 9), located between the upper and lower stages 33A and 33B. The plate 57 should have polished reflective surfaces and is preferably also water-cooled, such as through interior passages 59. The reflector plate 57 protects carriers in either or both of the two stages from thermal cross-talk, so that cooling of substrates on the lower stage is not slowed by the presence of a hot carrier on the upper stage. The reflector plate 57 also protects the processed wafers on the bottom stage 33B from material cross-contamination, and still further may provide structural support for the frame 31 itself. A flexible hose provides water cooling to the reflector plate in both upper and lower transfer assembly positions.

Optional Cold Plate Shape

The cold plate 39 quickly cools processed wafers to less than 200° C. The wafers may be seated on graphite susceptors 61 on a quartz carrier 15. In order that the entire wafer surface be cooled uniformly, it is desirable to sink the heat away from the wafers other than simply through conduction via the edges of the susceptors 61 into the carrier 15. One way to accomplish this is seen in FIG. 8, wherein the upper surface 63 of the cold plate 39 may be provided with a waffle-like shape with raised portions 65 that fit into corresponding openings 67 in the bottom of the carrier 15 into proximity with the underside of the susceptors 61, thereby providing for additional radiant cooling that increases uniformity of heat removal.

The invention claimed is:

1. A wafer preheating and conditioning load lock chamber coupled to a processing module in a wafer processing system, the load lock chamber comprising:
   a heater at a first stationary location within the load lock chamber;
   a cold plate at a second stationary location within the load lock chamber in vertical relation to the heater; and
   a three-level transport system located between the heater and cold plate and adapted to receive a wafer carrier at an intermediate transfer level and vertically move the carrier into a selected upper or lower level in proximity with one of the heater and cold plate, the three-level transport system having a two-position carrier transfer assembly with upper and lower stages, wherein in a lower position of the transfer assembly the upper stage is at the intermediate transfer level and the lower stage is at the lower level in proximity to the cold plate, and wherein in an upper position of the transfer assembly the lower stage is at the intermediate transfer level and the upper stage is at the upper level in proximity to the heater, wherein when the lower stage is at the intermediate transfer level it is at the same position as the upper stage when the upper stage is at the intermediate transfer level.

2. The load lock chamber as in claim 1, wherein coupling between one or more external motors and internal rollers in the stages of the carrier transfer assembly is provided by an electromagnetic clutch.

3. The load lock chamber as in claim 1, wherein internal rollers for each one of the upper and lower stages of the carrier transfer assembly are mechanically coupled, and the rollers of each stage are respectively driven by a single dedicated motor.

4. The load lock chamber as in claim 1, wherein a cooled reflector plate is provided as thermal isolation in the carrier transfer assembly and located between the upper and lower stages thereof.

5. The load lock chamber as in claim 1, wherein a surface of the cold plate has raised portions fitting within corresponding openings in an underside of a received wafer carrier when moved to the lower level proximate to the cold plate.

6. The load lock chamber as in claim 1, wherein the load lock chamber includes a first door interfacing with an external environment and a second door interfacing with a processing module.

* * * * *